| United States Patent [19] | [11] Patent Number: 4,880,721 |
| Ishikawa | [45] Date of Patent: Nov. 14, 1989 |

[54] LIGHT-SENSITIVE DUAL-WALLED MICROCAPSULE CONTAINING POLYMERIZABLE COMPOUND AND SILVER HALIDE, AND LIGHT-SENSITIVE MATERIAL EMPLOYING THE SAME

[75] Inventor: Shunichi Ishikawa, Kanagawa, Japan

[73] Assignee: Fuji Photo Film Co., Ltd., Kanagawa, Japan

[21] Appl. No.: 186,988

[22] Filed: Apr. 27, 1988

[30] Foreign Application Priority Data

Apr. 28, 1987 [JP] Japan .................................. 62-105099

[51] Int. Cl.$^4$ ........................... G03C 1/72; G03C 7/00
[52] U.S. Cl. ...................................... 430/138; 430/281; 430/270; 428/402.2; 428/402.21; 428/402.24; 252/174.13
[58] Field of Search .............. 430/138, 203, 281, 264, 430/270, 202; 252/174.13; 428/402.2, 402.21, 402.24

[56] References Cited

U.S. PATENT DOCUMENTS

| 4,399,209 | 8/1983 | Sanders et al. ....................... 430/138 |
| 4,629,676 | 12/1986 | Hayakawa et al. .................. 430/203 |
| 4,649,098 | 3/1987 | Takeda ................................. 430/202 |
| 4,816,367 | 3/1989 | Sakojiri et al. ....................... 430/138 |

FOREIGN PATENT DOCUMENTS

| 203613 | 12/1986 | European Pat. Off. . |
| 224214 | 6/1987 | European Pat. Off. ............ 430/138 |
| 229661 | 7/1987 | European Pat. Off. . |
| 182644 | 10/1983 | Japan ................................... 430/138 |

OTHER PUBLICATIONS

Gutcho, M. H., *Microcapsules and Microencapsulations Techniques*, Noyes Data Corporation, Chem. Tech. Rev. No. 73, 1976, pp. 12–15, 28–33 and 303–305.

*Primary Examiner*—Paul R. Michl
*Assistant Examiner*—Patrick A. Doody
*Attorney, Agent, or Firm*—Sughrue, Mion, Zinn, Macpeak & Seas

[57] ABSTRACT

A light-sensitive microcapsule contains a polymerizable compound enclosed with an inner shell of a polyurea resin and/or a polyurethane resin, and the inner shell is surrounded by an outer shell of an amino-aldehyde resin. The inner shell contains silver halide grains. A light-sensitive material employing the microcapsules is also disclosed.

16 Claims, No Drawings

LIGHT-SENSITIVE DUAL-WALLED MICROCAPSULE CONTAINING POLYMERIZABLE COMPOUND AND SILVER HALIDE, AND LIGHT-SENSITIVE MATERIAL EMPLOYING THE SAME

FIELD OF THE INVENTION

This invention relates to a light-sensitive microcapsule containing silver halide and a polymerizable compound, and further relates to a light-sensitive material comprising a light-sensitive layer containing silver halide, a reducing agent and a polymerizable compound provided on a support.

BACKGROUND OF THE INVENTION

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publications Nos. 45(1970)-11149 (corresponding to U.S. Patent No. 3,697,275), 47(1972)-20741 (corresponding to U.S. Patent No. 3,687,667) and 49(1974)-10697, and Japanese Patent Provisional Publications Nos. 57(1982)-138632, 57(1982)-152638, 57(1982)-176033, 57(1982)-211146 (corresponding to U.S. Pat. No. 4,557,997), 58(1983)-107529 (corresponding to U.S. Patent No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore, the process takes a relatively long time.

An improved image forming method employing a dry process is described in Japanese Patent Provisional Publication Nos. 61(1986)-69062 and 61(1986)-73145 (the contents of both publications are described in U.S. Pat. No. 4,629,676. In this image forming method, a recording material (i.e., light-sensitive material) comprising a light-sensitive layer containing a light-sensitive silver salt (i.e., silver halide), a reducing agent, a cross-linkage compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publications Nos 61(1986)-183640, 61-(1986)-188535 and 61(1986)-228441.

The above-mentioned image forming methods are based on the principle in which the polymerizable compound is polymerized in the portion where a latent image of the silver halide has been formed.

Further, Japanese Patent Provisional Publication No. 61(1986)-260241 describes another image forming method in which the polymerizable compound in a portion where a latent image of the silver halide has not been formed is polymerized. In the method, when the material is heated, the reducing agent functions as polymerization inhibitor in the portion where a latent image of the silver halide has been formed, and the polymerizable compound in the other portion is polymerized.

Japanese Patent Provisional Publications Nos. 61(1986)-275742 and 61(1986)-278849 describe an embodiment of the light-sensitive material, which employs microcapsules containing at least two components of the light-sensitive layer, that is polymerizable compound and a color image forming substance. The light-sensitive material having such a structure has an advantage of giving an image of high quality. The silver halide is generally contained in the microcapsules for the purpose of image formation in high sensitivity.

The light-sensitive layer comprises microcapsules containing silver halide and a polymerizable compound provided on support together with binders. The microcapsules require a certain firmness and denseness to obtain a preservability and to prevent flow produced in the course of handling. Especially, the polymerizable compound contained in the microcapsules is apt to escape from the microcapsule due to its relatively low boiling point and low molecular weight. Further, heat developing procedure is required in the image formation procedure. Accordingly, the microcapsules require further improved firmness and elaborateness.

The above publications also describe that the preferred examples of the shell materials of the microcapsules such as a polyurea resin and/or a polyurethane resin, or a urea/formaldehyde resin. However, the present inventor has found that unevenness in the image is observed and a color developed by flawing even if the microcapsules with a shell of a polyurea resin and/or a polyurethane resin, or an amino-aldehyde resin are used.

A light-sensitive microcapsule containing silver halide and a polymerizable compound enclosed with a shell of a polyurea resin and/or a polyurethane resin and a light-sensitive material employing the microcapsule, and a light-sensitive microcapsule containing silver halide and a polymerizable compound enclosed with a shell of an amino-aldehyde resin and a light-sensitive material employing the microcapsule have been already disclosed in Japanese Patent Application Nos. 61(1986)-53872 and 61(9186)-53873.

SUMMARY OF THE INVENTION

An object of the present invention is to provide a light-sensitive material which gives a clear image having a high contrast.

Another object of the invention is to provide a light-sensitive material which is improved in sensitivity, preservability and easiness of preparation.

A further object of the invention is to provide a light-sensitive microcapsule which shows high sensitivity to light and is advantageously employable for inclusion in the light-sensitive material.

There is provided by the present invention a light-sensitive microcapsule containing polymerizable compound enclosed with an inner shell of a polyurea resin and/or a polyurethane resin which is surrounded by an outer shell of an amino-aldehyde resin, characterized in that the inner shell contains silver halide grains.

There is also provided by the present invention a light-sensitive material comprising a light-sensitive layer containing silver halide grains and a polymerizable compound contained in microcapsules and a reducing agent provided on a support, wherein the microcapsules comprise an inner shell of a polyurea resin and/or a polyurethane resin in which the silver halide grains are contained, which is surrounded by an outer shell of an amino-aldehyde resin.

The light-sensitive microcapsule of the present invention has a double layered shell made of an outer shell of an amino-aldehyde resin which surrounds an inner shell of a polyurea resin and/or a polyurethane resin containing silver halide grains, whereby the light-sensitive microcapsule of the invention has high denseness and improved firmness as compared with the microcapsule comprising a simple layered shell.

In order to obtain an image having a high sensitivity, the silver halide and the polymerizable compound are contained in a microcapsule. In the microcapsule prepared in the known manner, the silver halide grains are located on the interface between the core material and the shell material of the microcapsule. Thus, the silver halide grains are almost embedded in the shell material.

The present inventor has found that the microcapsule having the above prepared shell is relatively poor in the denseness and firmness. From the above point of view, it is assumed that the unevenness in the image and color development are caused by oozing out the polymerizable compound and by easily ruptured microcapsules.

In the light-sensitive microcapsule of the present invention, the shell material has high denseness and improved firmness. Accordingly, the light-sensitive material employing the microcapsule gives an improved image having a high sensitivity and high contrast.

Further, the light-sensitive material has a stability for a long time preservation and easy to handle.

Furthermore, the light-sensitive microcapsule can be prepared easily by interfacial polymerization, although the microcapsule has a double layered shell.

DETAILED DESCRIPTION OF THE INVENTION

The light-sensitive microcapsule of the invention can be prepared by forming a shell (inner shell) around a core material by a surface polymerization process. The inner shell of the light-sensitive microcapsule is made of a polyurea resin or a polyurethane resin, or comprises a polyurea resin and a polyurethane resin. The inner shell contains silver halide grains, which is then surrounded by a shell of an amino-aldehyde resin (outer shell). The silver halide grains may be located on the interface between the core material and the inner shell of the microcapsule and contained partially or completely in the inner shell. In the present invenion, the silver halide grains preferably are embeded in the inner shell in the amount of not less than 70% per the total amount of the silver halide grains, and more preferably not less than 90%. The silver halide grains may be located within the core material of the microcapsule.

The inner shell of the light-sensitive microcapsule of the invention can be prepared by the following surface polymerization. The methods described in Japanese Patent Provisional Publication Nos. 50(1975)-28484 (corresponding to U.S. Pat. No. 3,981,821), 56(1981)-102935 (corresponding to U.S. Pat. No. 4,353,809) and 56(1981)-144739 (corresponding to GB2,073,697B) may also be used.

A preferred process for the preparation of the light-sensitive microcapsules of the invention is performed by dissolving a polyisocyanate compound in a core material of a hydrophobic liquid comprising a light-sensitive silver halide and a polymerizable compound, and if desired, a reducing agent and a dye or a dye precursor; then the hydrophobic liquid is dispersed in an aqueous medium containing a polyamine compound or a polyol compound to form a dispersion containing small droplets of the hydrophobic core material, wherein the dispersion preferably contains a catalyst for accelerating polycondensation reaction between the polyisocyanate compound and a polyamine compound and/or a polyol compound; and heating the dispersion to 40°-90° C. to form a polyurea resin (reaction product of the polyisocyanate compound and the polyamine compound or water) and/or a polyurethane resin (reaction product of the polyisocyanate compound and the polyol compound) to give light-sensitive microcapsules.

A number of processes for the preparation of microcapsules having a shell of a polyurea resin and a polyurethane resin other than the above-described preferable process are known. These processes are also employable for the preparation of the light-sensitive microcapsule of the invention.

In the present invention, the terms "polyurea resin" and "polyurethane resin" are not construed to indicate polymers containing, respectively, the urea bondings only or the urethane bondings only. For instance, the polyurethane resin include a polyurethane resin in which certain portions of the urethane bondings are replaced with urea bondings. This is also applied to the polyurea resin.

Examples of the polyisocyanate compounds, polyamine compounds, and polyol compounds include the following compounds.

The polyisocyanate can be a diisocyanate compound such as m-phenylene diisocyanate, p-phenylene diisocyanate, 2,6-tolylene diisocyanate, 2,4-tolylene diisocyanate, naphthalene-1,4-diisocyanate, diphenylmethane-4,4'-diisocyanate, 3,3'-dimethoxy-4,4'-biphenyl diisocyanate, 3,3'-dimethyl-4,4'-diisocyanate, xylylene-1,4-diisocyanate, xylylene-1,3-diisocyanate, 4,4'-diphenylpropane diisocyanate, trimethylene diisocyanate, hexamethylene diisocyanate, propylene-1,2-diisocyanate, butylene-1,2-diisocyanate, ethylidyne diisocyanate, cyclohexylene-1,2-diisocyanate or cyclohexylene-1,4-diisocyanate; a triisocyanate compound such as 4,4',4"-triphenylmethane triisocyanate, toluene-2,4,6-triisocyanate or polymethylene polyphenyl triisocyanate; a tetraisocyanate compound such as 4,4'-dimethyldiphenylmethane-2,2',5,5'-tetraisocyanate; or a polyisocyanate prepolymer such as an addition compound of hexamethylene diisocyanate and hexanetriol, an addition compound of 2,4-tolylene diisocyanate and catechol or an addition compound of tolylene diisocyanate and trimethylolpropane.

The polyamine compound can be ethylenediamine, trimethylenediamine, tetramethylenediamine, pentamethylenediamine, hexamethylenediamine, p-phenylenediamine, m-phenylenediamine, piperazine, 2-methylpiperazine, 2,5-dimethylpiperazine, 2-hydroxytrimethylenediamine, diethylaminopropylamine, tetraethylenepentamine, or an amine adduct of an epoxy compound.

The polyol compound can be ethylene glycol, 1,4-butanediol, chatecol, resorcinol, hydroquinone, 1,2-dihydroxy-4-methylbenzene, 1,3-dihydroxy-5-methylbenzene, 3,4-dihydroxy-1-methylbenzene, 3,5-dihydroxy-1-methylbenzene, 2,4-dihyroxyethylbenzene, naphthalene-diol, 1,5-naphthalenediol, 2,7-naphthalenediol, or 2,3-naphthalenediol.

The outer shell is then formed over the inner shell in the following manner.

To the dispersion containing microcapsules having a shell of a polyurea and/or a polyurethane resin is added a combination of urea and formaldehyde, or a melamineformaldehyde precondensate. The dispersion was adjusted with respect to such conditions as pH and temperature to cause outer polymerization around the shell made of a polyurea and/or a polyurethane resin to form a shell of an amino-aldehyde resin.

In the preparation of the outer shell made of an amino-aldehyde resin, it is preferred that at least one anionic protective colloid is previously contained in the aqueous medium.

The anionic protective colloid is employed for dispersing fine droplets of hydrophobic liquid in an aqueous medium and further for keeping the dispersed droplets from aggregation or unification. Appropriate material for the formation of anionic protective colloids for such a purpose are anionic polymers, which are exemplified by polystyrenesulfonate, styrene copolymers, polyvinylsulfonate ester salts, polyvinylsulfonates, maleic anhydride-styrene copolymer, maleic anhydride-isobutylene copolymer, maleic anhydride-ethylene copolymer, maleic anhydride-methyl vinyl ether copolymer, polyvinyl alcohol (saponified product), carboxymethyl-modified polyvinyl alcohol, gum arabic, polyacrylates, polyacrylate derivatives, acrylate copolymers, carboxymethyl cellulose, gelatin, pectin, pullulan, phthalated gelatin, succinated gelatin, other gelatin derivatives, cellulose sulfate ester salt, and alginic acid.

There are known processes for the preparation of the amino-aldehyde resin. Accordingly, such known processes are utilizable for the preparation of the amino-aldehyde resin shell for the formation of the microcapsule shell.

There are further known processes for the preparation of microcapsules by forming melamine-formaldehyde resin shells around small droplets of a hydrophobic liquid dispersed in an aqueous medium. Such known processes can be utilized for the preparation of the microcapsules of the invention. Examples of the known processes are described in Japanese Patent Provisional Publications Nos. 55(1980)-15660, 55(1980)-47139 and 56(1981)-51238, and U.S. Pat. Nos. 4,100,103 and 4,233,178.

There are also known processes for the preparation of microcapsules by forming urea resin shells around small droplets of a hydrophobic liquid dispersed in an aqueous medium. Such known processes can be utilized for the preparation of the microcapsules of the invention. Examples of the known processes are described in Japanese Patent Provisional Publication No. 55(1980)-119438, and U.S. Pat. No. 4,221,710.

Thus, a light-sensitive microcapsule having a double layered shell of an amino-aldehyde resin as the outer shell and a polyurea resin and/or a polyurethane resin as inner shell can be obtained.

In the light-sensitive microcapsule prepared by the above process, the silver halide grains are firmly contained in the microcapsule without running into the aqueous phase. In the present invention, a melamine formaldehyde resin is preferred.

For the incorporation of silver halide and a polymerizable compound into the hydrophobic liquid for the preparation of the core material, silver halide is generally incorporated first into an aqueous medium for the preparation of a silver halide emulsion and then the emulsion is mixed with a hydrophobic solvent. The aqueous medium of the silver halide emulsion is moved at a later stage into an aqueous medium employed for the preparation of the microcapsules. Thus, there is brought little water into the core of the obtained microcapsule. Simultaneously with the movement of water, silver halide grains move from the inside of the core material phase (oily phase) to the dispersion medium phase (aqueous phase), whereby most of silver halide grains gather in the vicinity of the interface between the core material phase and the dispersing medium phase. Accordingly, the silver halide grains are apt to be present in the vicinity or even within the inner shell at high concentration, if the silver halide is incorporated into the core material using a silver halide emulsion. On the other hand, the silver halide grains are not present within the outer shell. Such localized distribution of silver halide grains does not adversely affect the property of the light-sensitive capsule, and it is probable that such distribution is preferable in enhancement of the sensitivity.

The silver halide grains can be incorporated into the core material by other methods than the method using a silver halide emulsion. For instance, a dispersion containing silver halide grains dispersed in an organic solvent can be utilized for the incorporation. Alternatively, powdery silver halide can be simply mixed with a polymerizable compound.

A light-sensitive microcapsules prepared in the above-described manners can be separated from the aqueous medium by known separation methods such as evaporation, filtration and centrifugal separation.

The mean size of the microcapsule preferably ranges from 0.5 to 50 $\mu$m, more preferably 1 to 25 $\mu$m, most preferably 3 to 20 $\mu$m. The amount of the microcapsules having a particle size of not larger than one sixth part of the average particle size preferably is not more than 10 volume % of the total amount of the microcapsules. Further, the amount of the microcapsules having a particle size of not smaller than twice as large as the average grain size is not more than 10 volume % of the total amount of the microcapsules. Furthermore, the proportion of an average thickness of the shell of the microcapsules to the average grain size preferably ranges from $0.5 \times 10^{-2}$ to $5 \times 10^{-2}$.

The mean grain size of the silver halide grains preferably is not more than the 5th part of the mean size of the microcapsules, more preferably is not more than 10th part. It is observed that when the mean size of the microcapsules is not less than 5 times as much as the mean grain size of silver halide grains an even and uniform image can be obtained.

The silver halide, reducing agent, the polymerizable compound and the support which constitute the light-sensitive material of the invention are described below. Thus composed material is referred to herein as "light-sensitive material".

There is no specific limitation with respect to silver halide contained in the light-sensitive layer of the light-sensitive material. Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos.

57(1982)-154232, 58(1983)-108533, 59(1984)-48755 and 59(1984)-52237, U.S. Pat. No. 4,433,048, and European Patent No. 100,984) can be employed. A silver halide grain having a core/shell structure in which the silver halide content in the shell is higher than that in the core can be also employed.

There is no specific limitation on the crystal habit of silver halide grains. For example, a tabular grain having an aspect ratio of not less than 3 can be used.

The silver halide grains preferably have such a relatively low tendency to be fogged that the amount of developed silver is not more than 5 weight % based on the total amount of silver when the unexposed silver halide grains are developed in 1 l of an aqueous developing solution containing 1.0 g of metol, 15.0 g of sodium sulfite, 4.0 g of hydroquinone, 26.7 g of sodium carbonate monohydrate and 0.7 g of potassium bromide.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean grain (or particle) size of 0.001 to 5 $\mu$m, more preferably 0.001 to 2 $\mu$m.

The total silver content (including silver halide and an organic silver salt which is one of optional components) in the light-sensitive layer preferably is in the range from from 0.1 mg/m$^2$ to 10 g/m$^2$. The silver content of the silver halide in the light-sensitive layer preferably is not more than 1 g/m$^2$, more preferably in the range of from 1 mg to 500 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either an area where a latent image of the silver halide has been formed or an area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication nos. 61(1986)-183640, 61(1986)-188535 and 61(1986)-228441. These reducing agents are also described in T. James, "The Theory of the Photographic Process", 4th edition, pp. 291-334 (1977), Research Disclosure No. 17029, pp. 9-15 (June 1978), and Research Disclosure No. 17643, pp. 22-31 (December 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechoo, p-(n,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl2-2(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)butyloyl}-2-(p- or o-aminophenyl)hydrazine pentadecylflurocatrylate salt, 3-indazolinone, 1-(3,5-dichlorobenzoyl)-2-phenylhydrazine, 1-trityl-2-[{(2-N-butyl-N-octylsulfamoyl)-4-methanesulfonyl} phenyl]hydrazine, 1-{4-(2,5-di-tert-pentylphenoxy)-butyloyl}-2-(p- or o-methoxyphenyl)hydrazine, 1-(methoxycarbonylbenzohydryl)-2-phenylhydrazine, 1-formyl-2-{4-{2 -(2,4-di-tert-pentylphenoxy)butylamide} phenyl]hydrazine, 1-acetyl- 2-[4-{2-(2,4-di-tert-pentylphenoxy)butylamido}phenyl]hydrazine, 1-trityl-2-[{2,6-dichloro-4-(N,N-di-2-ethylhexyl)carbamoyl} phenyl]hydrazine, 1-(emthoxycarbonylbenzohydryl)-2-(2,4-dichlorophenyl)hydrazine and 1-trityl-2-[{2-(N-ethyl-N-octylsulfamoyl)-4-methanesulfonyl}phenyl} ]hydrazine.

The amount of the reducing agent in the light-sensitive layer preferably ranges from 0.1 to 1,500 mole % based on the amount of silver (contained in the abovementioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive material of the invention are described in the above-mentioned and later-mentioned publications and applications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, enopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinyldiene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

In the light-sensitive material, a polymer image can be obtained on a support by polymerization. Further, a color image can be obtained on a support by containing a color image forming substance in the light-sensitive layer.

The light-sensitive material of the present invention comprising a light-sensitive layer containing at least the polymerizable compound and the color image forming substance contained in the microcapsule.

The term "components contained in microcapsules" in the present specification means core materials which constitute microcapsules and/or components contained in the shell materials.

In the light-sensitive material of the invention, the silver halide, polymerizable compound and reducing agent are contained in microcapsules to form light-sensitive microcapsules which are dispersed in the light-sensitive layer. The color image forming substance is preferably contained in the light-sensitive microcapsules. It is preferred that five or more silver halide grains are contained in the light-sensitive microcapsules. Further, the silver halide grains are arranged in the shell of the microcapsules.

The light-sensitive material can be prepared by arranging a light-sensitive layer containing the above-mentioned components on a support. There is no limitation with respect to the support. In the case that a heat development is utilized in the use of the light-sensitive material, the support preferably is restraint to heat given in the processing stage. Examples of the material employable as the support include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support, the porous support preferably has such a surface characteristic that a filtered maximum waviness of not less than 4 $\mu$m is observed in not more than 20 positions among 100 positions which are determined at random on a filtered waviness curve obtained according to JIS-B-0610. A surface of a paper support preferably has a low water absorptiveness of not more than 3 g/m$^2$ which is a value measured according to Cobb test method. A surface of the paper support preferably has such a smooth surface that the smoothness value in terms of the Bekk Smoothness is not less than 300 seconds. A paper support preferably has a low shrinkage ratio of not more than 0.15% both in the machine direction and in the cross direction, wherein the shrinkage ratio is a value measured at the change of relative humidity from 75% to 60%. Further, a paper support preferably has a low air permeability of not less than 300 seconds, wherein the air permeability is a time required for 100 ml of air to pass through the paper support of an area of 645 mm$^2$ at pressure of 567 g. Furthermore, a paper support preferably has a pH value in the range of 5 to 9.

Various embodiments of the light-sensitive materials, optional components which may be contained in the light-sensitive layer, and auxiliary layers which may be optionally arranged on the light-sensitive materials are described below.

The light-sensitive layer can further contain optional components such as color image forming substances, sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiator, solvent of the polymerizable compound and water soluble vinyl polymers.

There is no specific limitation with respect to the color image forming substance, and various kinds of substances can be employed. Thus, examples of the color image forming substance include both colored substance (i.e., dyes and pigments) and non-colored or almost noncolored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145.

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acidbase reaction, oxidation-reduction reaction, coupling reaction, chelating reaction, and the like. Examples of such color formation systems are described in Hiroyuki Moriga, "Introduction of Chemistry of Specialty Paper" (in Japanese, 1975), pp. 29–58 (pressure-sensitive copying paper), pp. 87–95 (azo-graphy), pp. 118–120 (heat-sensitive color formation by a chemical change) or in MSS. of the seminar promoted by the Society of Kinki Chemical Industry, "The Newest Chemistry of Coloring Matter - Attractive Application and New Development as a Functional Coloring Matter", pp. 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

In the case that the color image forming substance comprises two components (e.g., color former and a developer), one component and the polymerizable compound is contained in the microcapsule, and the other component is arranged outside of the microcapsule in the light-sensitive layer, a color image can be formed on the light-sensitive layer.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mole per 1 mol of silver halide. The sensitizing dye is preferably added during the stage of the preparation of the silver halide emulsion (simultaneously with or after the grain formation).

The sensitizing dye is preferably added during the stage of the preparation of the silver halide emulsion.

In the heat-development process, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Examples of the radical generators include triazene-silver, silver diazotate and an azo compound.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function.

The image formation accelerators can be classified into bases, base precursors, oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

The base or base precursor can be arranged outside of the microcapsules containing the components of the light-sensitive layer, such as silver halide and polymerizable compound. In this case, the base or base precursor preferably is a hydrophobic compound having melting point of 80° to 180° C. in the form of solid particles.

A base precursor can be used in combination with a catalyst for decomposing the base precursor. For example, a propiolate type base precursor can be used in combination with a catalyst such as silver, copper, a silver compound and a copper compound. Further, the propiolate type base precursor or a sulfonylacetate type base precursor can be used in combination with a hot-melt solvent, which functions as a catalyst for decomposing the base precursor.

In the light-sensitive material, the silver halide, the reducing agent and the polymerizable compound are preferably contained in microcapsules and the base or base precursor is preferably arranged outside of the microcapsule in the light-sensitive layer. Further, the base or base precursor can be contained in different microcapsules from those containing the polymerizable compound. The base or base precursor can be contained in the microcapsules under a condition that the base or base precursor is dissolved or dispersed in an aqueous solution of a water retention agent, or under a condition that the base or base precursor is adsorbed on solid particles. The base or base precursor contained in the microcapsules preferably has a melting point in the range of 70° to 210° C.

The base or base precursor can be contained in a layer different from the light-sensitive layer. Further, the base or base precursor can be contained in a porous support.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication no. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (including a cyclic amide compound), a thiourea derivative, a thioether compound, a polyethylene glycol derivative, a thiol derivative, an acetylene compound, a sulfonamide derivative and a quaternary ammonium salt.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure pp. 26–28 (December 1976). The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-zaobis(e-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating, electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The dyes or pigments can be contained in the light-sensitive layer for the purpose of anti-halation or anti-irradiation. Further, white pigments can be contained in the light-sensitive layer for the purpose of anti-halation or anti-irradiation.

The dyes having a property of being decolorized when it is heated or irradiated with light can be used in the light-sensitive material as a yellow filter layer in a conventional silver salt photographic system.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles such as particles of talc, kaolin, bentonite, agalmatolite, zinc oxide, titanium dioxide or alumina described in U.S. Patent No. 2,711,375. Such particles preferably have a mean size of 3 to 50 $\mu$m, more preferably 5 to 40 $\mu$m. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1985)-69062 (corresponding to U.S. Pat. No. 4,629,676 and European Patent Provisional Publication No. 0174634A2).

In the case that the solvent of the polymerizable compound is used, the solvent is preferably contained in a microcapsule which is different from the light-sensitive microcapsule.

In the case that the water soluble vinyl polymer is used, the polymers are preferably adsorbed on the silver halide grains.

Examples and usage of the other optional components which can be contained in the light-sensitive layer are also described in the above-mentioned publications and applications concerning the light-sensitive material, and in Research Disclosure Vol. 170, No. 17029, pp. 9–15 (June 1978). The light-sensitive layer preferably has a pH value of not more than 7.

Examples of auxiliary layers which are optionally arranged on the light-sensitive material include an image-receiving layer, a heating layer, an antistatic layer, an anticurl layer, a release layer, a cover sheet or a protective layer and an antihalation layer (colored layer).

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving layer. The details of the image-receiving layer will be described later.

Examples and usage of the other auxiliary layers are also described in the above-mentioned publications and applications concerning the light-sensitive material.

The light-sensitive material of the invention can be prepared, for instance, by the following process.

The light-sensitive material is usually prepared by dissolving, emulsifying or dispersing each of the components of the ligt-sensitives layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Preparations of liquid compositions and coating solutions of the components contained in the light-sensitive layer are described hereinbelow.

The iridium salt is preferably introduced in the course of the stage of the preparation of the silver halide emulsion to obtain the silver halide grain containing iridium ion of the invention.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentration or amounts of the silver salt and halogen salt to be added or the rate of their addition can be increased as described in Japanese Patent Provisional Publications Nos. 55(1980)-142329 and 55(1980)-158124, and U.S. Pat. No. 3,650,757, etc.

The silver halide emulsion may be of a surface latent image type that forms a latent image predominantly on the surface of the silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West Germany Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivative; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water soluble iridium salt, e.g., iridium (III) or (IV) chloride, or ammonium hexachloroiridate, or a water soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added in the course of the preparation of the emulsion. When the organic silver salts are introduced in the light-sensitive microcapsule, the emulsion of the organic silver salts can be prepared in the same manner as in the preparation of the silver halide emulsion.

In the preparation of the light-sensitive material the polymerizable compound (the term, "polymerizable compound" includes the photo polymerizable composition and photo polymerizable compound) is used as the medium for preparation of the liquid composition containing another component of the light-sensitive layer. For example, the silver halide, (including the silver halide emulsion), the reducing agent, the photo polymerization initiator or the color image forming substance can be dissolved, emulsified or dispersed in the polymerizable compound to prepare the light-sensitive material. Especially, the color image forming substance is preferably incorporated into the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can also be prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, -OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping this dispersed state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

Instead of employing the above polymer, the light-sensitive composition can be prepared by dispersing the microcapsules having the silver halide emulsion as core material in the emulsion of the polymerizable compound.

A dispersion of the microcapsule having a shell material which is composed of an outer shell of aminoaldehyde resin and an inner shell of a polyurea resin and/or a polyurethane resin is prepared according to the above-mentioned capsuling method. If desired, optional components can be added to the dispersion of microcapsule to prepare a coating solution.

A light-sensitive material of the invention can be prepared by coating and drying the above-prepared coating solution on a support in the conventional manner.

Use of the light-sensitive material is described below.

In the use of the light-sensitive material of the invention, a development process is conducted simultaneously with or after an imagewise exposure.

Various exposure means can be employed in the imagewise exposure, and in general, the latent image of the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat-development process can be conducted in various known manners. The heating layer which is arranged on the light-sensitive material can be used as the heating means in the same manner as the light-sensitive material described in Japanese Patent Provisional Publication No. 61(19860294434. The light-sensitive material is preferably heated while suppressing supply of oxygen into the light-sensitive layer from outside. Heating temperatures for the development process usually ranges from 80° C. to 200° C., and preferably from 100° C. to 160° C. Various heating patterns are applicable. The heating time is usually not shorter than 1 second, preferably from 1 second to 5 minutes, and more preferably from 1 second to 1 minute.

Instead of bases or base precursors contained in the light-sensitive material, the development can proceed simultaneously or thereafter the bases or base precursors can be added to the light-sensitive layer. A base sheet (a sheet in which a base is contained) is preferably employed.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

A polymer image can be formed on the light-sensitive layer in the above process. A color image can be obtained by fixing a dye or pigment on a polymer image.

Further, a color image can be formed on the light-sensitive material in which the light-sensitive layer contains a color former and a developer, one of them is together with the polymerizable compound contained in a microcapsule, and the other is arranged outside of the microcapsule.

The image can be also formed on the image-receiving material. The image-receiving material is described hereinbelow.

Examples of the material employable as the support of the image-receiving material include baryta paper in addition to various examples which can be employed as the support of the known light-sensitive material. In the case that a porous material, such as paper is employed as the support of the image-receiving material, the porous support preferably has such a surface characteristic that a filtered maximum waviness of not less than 4 $\mu$m is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material can be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-sensitive layer is also employable in the image-receiving layer. Further, a polymer having a transmission coefficient of oxygen of not more than $1.0 \times 10^{-11}$ cm$^3$.cm/cm$^2$.sec.cmHg can be used as the binder to protect the color of the image formed on the image-receiving material.

The image-receiving layer can contain a granulated thermoplastic compound to obtain a glossy image. There is no specific limitation with respect to the thermoplastic compound. Examples of the thermoplastic compound can include a known plastic resin and wax. The thermoplastic resin preferably has a glass transition temperature of not more than 200° C. The wax preferably has a melting point of not more than 200° C.

A photopolymerization initiator or a thermalpolymerization initiator can be contained in the image-receiving layer to polymerize the transferred unpolymerized polymerizable compound, so that the obtained image is fixed on the image-receiving layer.

A dye or pigment can be contained in the imagereceiving layer for the purpose of entering letters, symbols, frames etc. in the image-receiving layer, or of giving a certain color to the background of the image. Further, the dye or pigment can be also employed for the purpose of making it easy to distinguish the sides of the image-receiving material. In the case that it is possible that the dye or pigment disturbs the image formed on the image-receiving layer, it is preferred that the density of the dye or pigment is low (e.g. reflection density of not higher than 1), or the dye or pigment has a property of being decolored when it is heated or irradiated with light.

Further, when a white pigment, such as titanium dioxide, barium sulfate etc. is contained in the image-receiving layer, the image-receiving layer can function as a white reflection layer. In this case, the white pigment is used in an amount of from 10 g to 100 g based on 1 g of the thermoplastic material.

The above-mentioned dye and pigment can be either uniformly or partially contained in the image-receiving layer. For example, when the support is composed of transparent material, the white pigment can be partially contained in the image-receiving layer to make a part of a reflection image to be transparent. Thus, information of the image which is unnecessary in a transparent image can be entered in the part of the image-receiving layer containing the white pigment as the reflection image.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer. A layer containing a granulated thermoplastic compound can be also provided on the image-receiving layer.

A layer containing an adhesive and a release paper can be provided in the order on the support of the image-receiving material on the opposite side of the image-receiving layer.

After the image exposure and/or the development process, pressing the light-sensitive material on the image-receiving material to transfer the unpolymerized polymerizable compound to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material in the image-receiving material to transfer the color image forming substance in unfixed portion, a color image can be produced on the image-receiving material.

After the image is formed on the image-received material, the image-receiving material can be heated to polymerize the transferred unpolymerized polymerizable compound. By the above-mentioned process, the obtained image can be improved in the preservability.

Various image recording apparatus can be used for the image-forming method. An example of the apparatus comprises an exposure device for imagewize exposing the light-sensitive material to form a latent image, a heat development device for fixing the area corresponding to the latent image, a transfer device for pressing the developed light-sensitive material on the image-receiving material. Another example of the apparatus comprises an fixing apparatus for irradiating with light, pressing or heating the image-receiving material on which an image has been transferred in addition to the above-mentioned devices.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of silver halide emulsion

In 1,200 ml of water were dissolved 25 g of gelatin and 3 g of potassium bromide, and the resulting gelatin solution was kept at 70° C. To the gelatin solution, 600 ml of an aqueous solution containing 117 g of potassium bromide and 600 ml of an aqueous solution containing 0.74 mole of silver nitrate were added simultaneously at the same feed rate over 45 minutes. Further, after 5 minutes, to the resulting mixture was added 200 ml of an aqueous solution containing 4.3 g of potassium iodide at the same feed rate over 5 minutes. The resulting solution was washed for desalting, and to the emulsion was added 24 g of gelatin and stirred at 50° C. for 15 minutes to obtain a silver halide emulsion. The yield of the emulsion was 1,000 g.

Preparation of W/O emulsion

In 100 g of trimethylolpropane triacrylate were dissolved 0.4 g of the following copolymer and 10 g of Pargascript Red I-6-B (tradename of Ciba-Geigy).

(Copolymer)

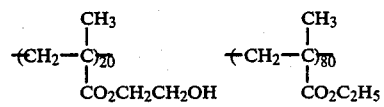

In 18.0 g of the resulting solution was dissolved 0.36 g of the surface active agent (tradename "Nissan nonion NS 208.5" produced by Nippon Oils & Fats Co., Ltd.) and to the solution was then added a solution in which 1.29 g of the following reducing agent (I) and 1.22 g of the following reducing agent (II) was dissolved in 4 g of the methylene chloride to obtain an oily phase (O).

(Reducing agent (I))

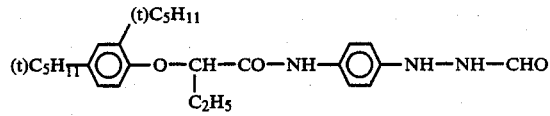

(Reducing agent (II))

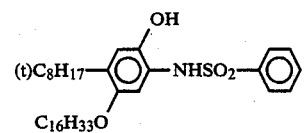

To 2.0 g of the silver halide emulsion were added 0.45 g of 10% aqueous solution of potassium bromide and 0.022 g of benzotriazole to obtain an aqueous phase (W).

Further, to the oily phase (O) was added the aqueous phase (W), and the mixture was stirred at 15,000 r.p.m. using homogenizer for 5 minutes to obtain W/O emulsion.

Preparation of light-sensitive microcapsule

To 5% aqueous solution of partial sodium salt of polyvinylbenzene sulfonic acid (tradename VERSA TL 500 produced by National Starch, Co.) was added 20% aqueous solution of phosphoric acid, and adjusted to pH 3.5. To the aqueous solution was added the W/O emulsion in which 0.9 g of an adduct of xylene diisocyanate was dissolved, and stirred at 7,000 r.p.m. for 30 minutes using homogenizer at 40° C. to obtain W/O/W emulsion which was covered with a shell made of polyurea resin.

Independently, the mixture of 13.2 g of melamine, 21.6 g of 37% aqueous solution of formaldehyde and 70.8 g of water was stirred at 60° C. for 30 minutes to give a transparent melamine-formaldehyde precondensate.

To the above W/O/W emulsion was added 10 g of the precondensate. The mixture was then adjusted to pH 6.0 using 20% aqueous solution of phosphoric acid, and then was stirred for 90 minutes at 65° C. to obtain a dispersion containing a shell material comprising melamine-formaldehyde resin. Further, to the obtained dispersion was added 5.4 g of 40% aqueous solution of urea and was adjusted to pH 3.5 using 20% aqueous solution of phosphoric acid while stirring for 40 minutes. To the resulting dispersion was adjusted to pH 7.0 using 10% aqueous solution of sodium hydroxide and was cooled.

Preparation of light-sensitive material

To 5.0 g of the microcapsule dispersion was added 1.8 g of 10% aqueous solution (solvent: water/ethanol-50/50 as volume ratio) of guanidine trichloroacetate to obtain a coating solution. The coating solution was coated on a polyethylene terephthalate film having a thickness of 100 μm in coating amount of 70 g/m$^2$ and dried at 40° C. to obtain a light-sensitive material (I).

COMPARISON EXAMPLE 1

Preparation of light-sensitive microcapsule

A dispersion containing light-sensitive microcapsules having a polyurea resin shell was prepared in the same manner as in Example 1 except that the melamineformaldehyde precondensate was not added.

Preparation of light-sensitive material

A light-sensitive material (II) was prepared in the same manner as in Example 1 except that the dispersion containing light-sensitive microcapsules having a polyurea resin shell was used instead of the dispersion containing light-sensitive microcapsule having a polyurea resin shell and a melamine-formaldehyde resin shell.

COMPARISON EXAMPLE 2

Preparation of light-sensitive microcapsule

A dispersion containing light-sensitive microcapsules having an melamine-formaldehyde resin shell in the same manner as in Example 1 except that Takenate D110N was not added.

Preparation of light-sensitive material

A light-sensitive material (III) was prepared in the same manner as in Example 1 except that the dispersion containing light-sensitive microcapsule having a melamine-formaldehyde resin shell was used instead of the dispersion containing light-sensitive microcapsule having a polyurea resin and a melamine-formaldehyde resin shell.

Preparation of image-receiving material

To 125 g of water was added 11 g of 40% aqueous solution of sodium hexametaphosphate, and were further added 34 g of zinc, 3,5-di-α-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50 % latex of SBR (styrene-butadiene rubber) and 55 g of 8% aqueous solution of polyvinyl alcohol, and the resulting mixture was made uniform. The mixture was then uniformly coated on a paper having basis weight of 80 g/m$^2$ to give a layer having a wet thickness of 30 μm and dried to obtain an image-receiving material.

Evaluation of light-sensitive materials

Each of the light-sensitive materials prepared in Example 1 and Comparison Examples 1 & 2 was imagewise exposed to light using a tungsten lamp at 200 lux for 1 second through a filter having maximum density of 4.0 and minimum density of 0.1, and then heated on hot plate at 125° C. for 30 seconds. Each of the exposed and heated light-sensitive materials was then combined with the image-receiving material and passed through press rolls at pressure of 500 kg/cm$^2$ to obtain a magenta positive image on the image-receiving material. The density of the obtained magenta positive image was measured using Macbeth's reflection densitometer.

The results are set forth in Table 1.

TABLE 1

| Light-sensitive material | Minimum density | Maximum density |
|---|---|---|
| (I) | 0.08 | 1.40 |
| (II) | 0.35 | 1.40 |
| (III) | 0.60 | 1.40 |

It is apparent from the results in Table 1, the light-sensitive material (I) of the present invention can give a clear image having high contrast and reduced in occurrence of unevenness in the image and color development depending on the running out of the core materials or rupturing of the microcapsules.

I claim:

1. A light-sensitive microcapsule containing an ethylenically unsaturated polymerizable compound which is enclosed with an inner shell of a polyurea resin or a polyurethane resin which is surrounded by an outer shell of an amino-aldehyde resin, wherein the inner shell contains silver halide grains.

2. The light-sensitive microcapsule as claimed in claim 1, wherein the silver halide grains are contained in the inner shell in the amount o not less than 70% per the total amount of the silver halide grains.

3. The light-sensitive microcapsule as claimed in claim 1, wherein the outer shell of an amino-aldehyde resin is a shell of a melamine-formaldehyde resin.

4. The light-sensitive microcapsule as claimed in claim 1, wherein the inner shell is made of a polyurea resin prepared by a reaction between a polyisocyanate compound contained together with the silver halide and the polymerizable compound in a hydrophobic droplet and a polyamine compound contained in an aqueous medium in which the hydrophobic droplet is dispersed.

5. The light-sensitive microcapsule as claimed in claim 1, wherein the inner shell is made of a polyurethane resin prepared by a reaction between a polyisocyanate compound contained together with the silver halide and the polymerizable compound in a hydrophobic droplet and a polyol compound contained in an aqueous medium in which the hydrophobic droplet is dispersed.

6. The light-sensitive microcapsule as claimed in claim 1, wherein a reducing agent is further contained in the microcapsule.

7. The light-sensitive microcapsule as claimed in claim 1, wherein a color image forming substance is further contained in the microcapsule.

8. The light-sensitive microcapsule as claimed in claim 1, wherein the microcapsule has an average diameter in the range of 0.5 to 50 $\mu$m.

9. A light-sensitive material comprising a light-sensitive layer containing silver halide grains and an ethylenically unsaturated polymerizable compound contained in microcapsules and a reducing agent provided on a support, wherein the microcapsules comprise an inner shell of a polyurea resin or a polyurethane resin in which the silver halide grains are contained, which is surrounded by an outer shell of an amino-aldehyde resin.

10. The light-sensitive material as claimed in claim 9, wherein the silver halide grains are contained in the inner shell of the microcapsule in the amount of not less than 70% per the total amount of the silver halide grains.

11. The light-sensitive material as claimed in claim 9, wherein the outer shell of the microcapsule of an amino-aldehyde resin is a shell of a melamineformaldehyde resin.

12. The light-sensitive material as claimed in claim 9, wherein the inner shell of the microcapsule is made of a polyurea resin prepared by a reaction between a polyisocyanate compound contained together with the silver halide and the polymerizable compound in a hydrophobic droplet and a polyamine compound contained in an aqueous medium in which the hydrophobic droplet is dispersed.

13. The light-sensitive material as claimed in claim 9, wherein the inner shell of the microcapsule is made of a polyurethane resin prepared by a reaction between a polyisocyanate compound contained together with the silver halide and the polymerizable compound in a hydrophobic droplet and a polyol compound contained in an aqueous medium in which the hydrophobic droplet is dispersed.

14. The light-sensitive material as claimed in claim 9, wherein the reducing agent is contained in microcapsules.

15. The light-sensitive material as claimed in claim 9, wherein the color image forming substance is contained in microcapsules which are dispersed in the light-sensitive layer.

16. The light-sensitive material as claimed in claim 9, wherein the microcapsule has an average diameter in the range of 0.5 to 50 $\mu$m.

* * * * *